United States Patent
Morikawa et al.

(10) Patent No.: US 8,164,028 B2
(45) Date of Patent: Apr. 24, 2012

(54) RESISTANCE HEATER

(75) Inventors: Yuji Morikawa, Himeji (JP); Yoshihiko Matsui, Himeji (JP); Akinobu Otaka, Hyogo (JP); Takeshi Higuchi, Hyogo (JP); Kensuke Fujimura, Nasu-machi (JP)

(73) Assignee: Momentive Performance Materials Inc., Albany, NY (US)

( * ) Notice: Subject to any disclaimer, the term of this patent is extended or adjusted under 35 U.S.C. 154(b) by 494 days.

(21) Appl. No.: 12/321,284

(22) Filed: Jan. 16, 2009

(65) Prior Publication Data

US 2009/0200288 A1  Aug. 13, 2009

Related U.S. Application Data

(60) Provisional application No. 61/021,907, filed on Jan. 18, 2008.

(51) Int. Cl.
*H05B 3/68* (2006.01)
(52) U.S. Cl. .................................... 219/444.1
(58) Field of Classification Search ............... 219/444.1, 219/443.1, 406–410, 542–549
See application file for complete search history.

(56) References Cited

U.S. PATENT DOCUMENTS

| | | | | |
|---|---|---|---|---|
| 3,888,613 A | * | 6/1975 | Fries et al. | 425/160 |
| 3,892,940 A | * | 7/1975 | Bloem et al. | 219/634 |
| 5,306,898 A | * | 4/1994 | Yukawa et al. | 219/543 |
| 5,649,554 A | * | 7/1997 | Sprinkel et al. | 131/329 |
| 5,702,764 A | * | 12/1997 | Kimura et al. | 427/248.1 |
| 7,075,042 B2 | * | 7/2006 | Kirby | 219/541 |

FOREIGN PATENT DOCUMENTS

| JP | 2005086117 | 3/2005 |
|---|---|---|
| JP | 2008140647 | 6/2008 |

* cited by examiner

*Primary Examiner* — Huy Q Phan
*Assistant Examiner* — Kathryn Chang
(74) *Attorney, Agent, or Firm* — Joseph E. Waters

(57) ABSTRACT

A heater has a smooth heating surface and a recess formed on a second surface opposite to the heating surface. The recess is formed between opposite side walls in a lengthwise direction of the heater. Formation of the recess improves the electrical resistance of the heater and the opposite side walls reinforce the heater and prevent deformation of the heater when it is subjected to high temperatures in a semiconductor wafer processing device. The heater has substantially the same width along its lengthwise direction. This improves the control of heat pattern design, because the terminal end portions do not have an expanded shape.

10 Claims, 5 Drawing Sheets

(a)

3

(b)

RESISTANCE HEATER

CROSS-REFERENCE TO RELATED APPLICATIONS

The present application claims priority to U.S. Provisional application Ser. No. 61/021,907 filed on Jan. 18, 2008, and which is herein incorporated by reference.

BACKGROUND OF INVENTION

The present invention relates to a resistance heater made from a material such as graphite, SiC, etc., and more particularly to a heater to be used for directly or indirectly heating a semiconductor wafer in a semiconductor wafer processing device in which, for example, CVD (chemical vapor deposition) or other coating method is carried out.

An example of the prior art heaters is disclosed in Japanese patent publication No. 2005-86117(A). This heater uses an elongated ceramic body of a rectangular cross-section having greater width than thickness, which is formed into a ring or spiral configuration. This heater has low electric resistance, so that it will be required to use a power source that operates with low voltage and high current, resulting in increase of costs for the power source. In addition, this heater will tend to be bent, warped or deformed especially when it is subjected to a high temperature condition. This makes it impossible to uniformly heat a wafer or any other object to be processed at high temperature.

A typical shape of the prior art heater is shown in FIG. 3 herein, which includes an expanded view of terminal end portion with a connecting hole. The reason the terminal end portions have a widened and expanded shape at the end portion is that there needs to be decreased electric resistance at that portion so as to prevent that portion from over-heating. However, when using this heater, the expanded terminal end portion could make designing a heat pattern more difficult. A simple heat pattern could not be achieved with the prior art heater having the expanded terminal end portions.

SUMMARY OF INVENTION

Accordingly, the present invention provides a heater having higher electric resistance and improved strength to prevent deformation of the heater even in a high temperature condition. The present invention also prevents excessive heat generation at terminal end portions of a heater, while the terminal end portion remains narrow and not expanded, thereby providing a wider choice in heat pattern design.

To achieve these objects, in accordance with an aspect of the present invention, a heater is provided having a smooth heating surface and a recess formed on a second surface opposite to the heating surface. The smooth heating surface provides a sufficient area for heating an object and assures uniform heating thereto, whereas the recess formed on the second surface reduces a cross-section of the heater and, thereby, increases electric resistance. Accordingly, it provides minimization of size and cost of a power source to be used, in comparison with the prior art heater having rectangular cross-section.

In a preferred embodiment, the recess is formed between opposite side walls on the second surface and extends in a lengthwise direction of the heater. The opposite side walls also extends in a lengthwise direction of heater, which reinforces the heater and prevents the heater from being bent, warped or deformed even when the heater is subjected to a high temperature condition. When the heater is coated with a protective film of pyrolitic boron nitride (pBN), SiC, etc., it can withstand the high temperatures encountered in a wafer coating process, thereby preventing or minimizing deformation.

In another preferred embodiment, the heater has substantially the same width along its lengthwise direction. In other words, opposite end portions with terminal connecting holes are formed to have substantially identical width to a heating area defined between said opposite end portions, and the recess is formed on the second surface except the opposite end portions. This improves the freedom of heat pattern design, because the terminal end portions do not have a wider or expanded shape. In accordance with the present invention, even the heating area and the terminal end portions have the same width, the heating area has the recess at the underside but the terminal end portions have no recess, which means that the terminal end portions have a greater cross-sectional area available to current flow and, therefore, a lower electric resistance relative to the middle heating portion of the heater body. Consequently, it is possible to prevent excessive heat generation at the terminal end portions and improve uniformity of in-plane temperature distribution of the object to be heated.

BRIEF DESCRIPTION OF DRAWINGS

Other objects and advantages of the present invention can be understood from the following description when read in conjunction with the accompanying drawings in which:

FIG. 3 shows a conventional heater, in which FIG. 3(a) is a partial plan view thereof and FIG. 3(b) is an enlarged cross-section taken along B-B in FIG. 3(a).

DETAILED DESCRIPTION OF THE INVENTION

Figure 1:
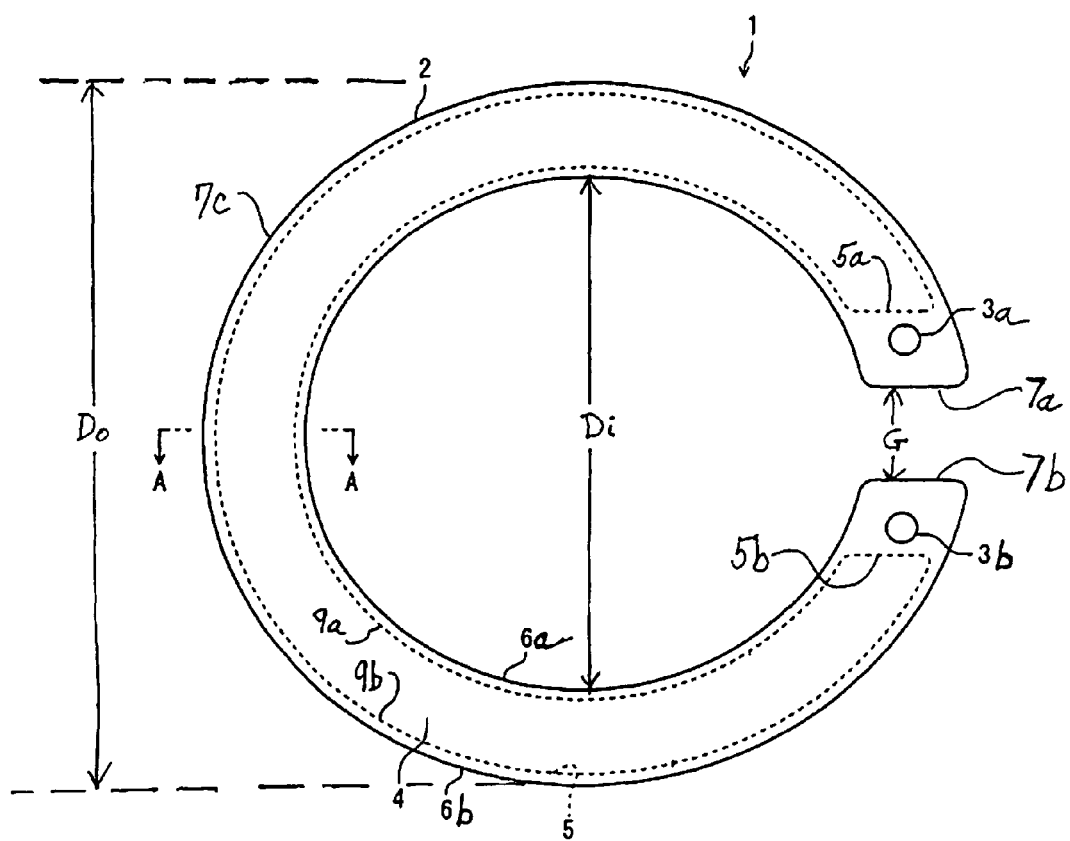
FIG. 1 is a plan view of a heater embodying the present invention.
Figure 2:
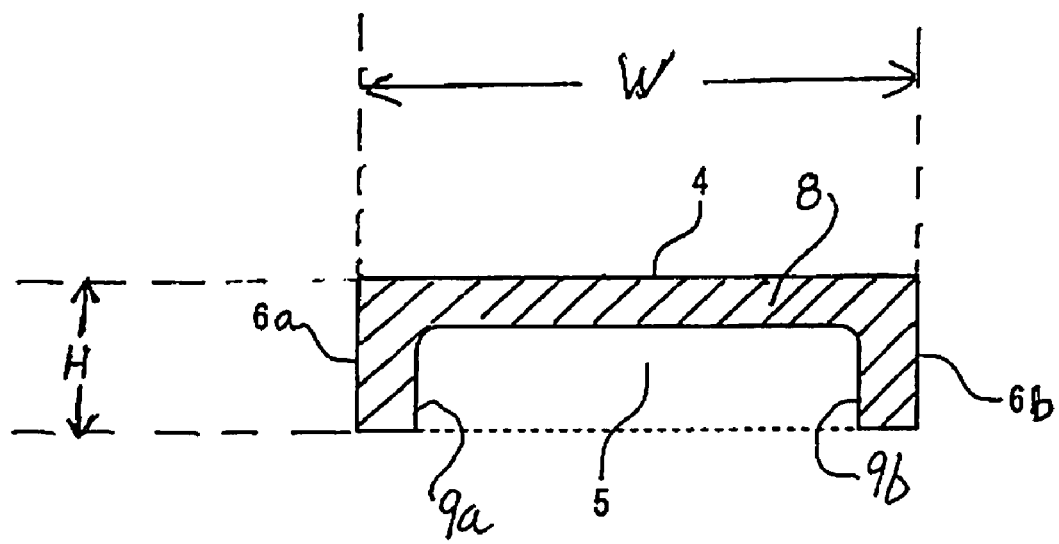
FIG. 2 is an enlarged cross-section taken along A-A in FIG. 1.
Figure 3:
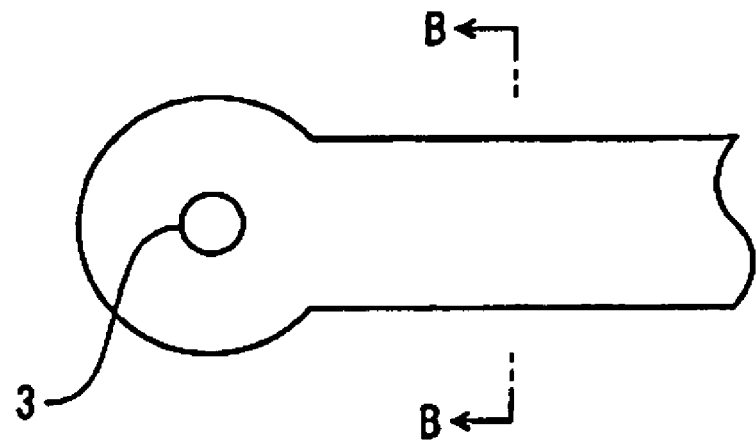
Figure 3:
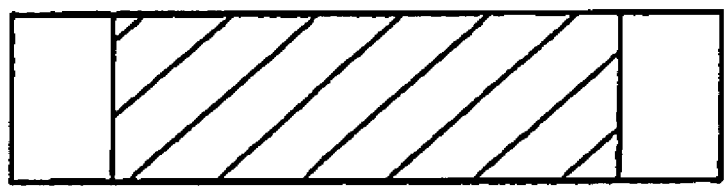

A heater embodying the present invention is shown in FIGS. 1 and 2. Heater 1 comprises a C-shaped heater body 2 made from a material such as graphite, ceramics such as SiC, etc. There are terminal connecting holes 3a, 3b at respective end portions of the C-shaped heater body 2, the opposing exterior end surfaces 7a and 7b being spaced apart so as to define a gap G therebetween. The connecting holes 31 and 3b are the points of attachment of an electrical power source which provides the electric current to the heater 1. By way of example, in this embodiment the heater body 2 can have a cross-section width W of about 10 mm, a height H of about 6 mm, an inner diameter Di of about 110 mm and an outer diameter Do of about 130mm. These dimensions are exemplary of a suitable size. Other dimensions can be selected when appropriate.

As clearly shown in FIG. 2, which is an enlarged cross-section taken along A-A in FIG. 1, the heater body 2 has an upper horizontal wall 8 having a smooth and flat top heating surface 4 onto which an object to be heated, such as a wafer, is mounted directly or indirectly via a susceptor, etc. A center portion of the underside of the heater body 2 is recessed to form an elongated groove or recess 5 between a pair of opposite vertical side walls or ribs 6a, 6b, said side walls having inner surfaces 9a and 9b which at least partially define recess 5. The recess 5 and side walls 6a, 6b extend in an arcuate linear direction of the C-shaped heater body 2 so as to provide an inverted U-shaped cross section along a middle portion 7c of the heater, but not at the end portions of the heater body. In particular, the recess 5 terminates at end surfaces 5a and 5b, the portion of the body between recess end surfaces 5a and 5b and the respective exterior end surfaces 7a and 7b defining the respective end portions of the body. In one embodiment, the underside of the heater body having 20 mm width comprises the recess 5 having 16 mm width and the opposite side walls 6a, 6b, each having 2 mm width. The recess 5 is 4 mm deep from the underside of the heater body 2, leaving the upper horizontal wall 8 of 2 mm thickness.

As indicated above, it is a feature of the invention that body 2 has the same width W along its entire length, including both end portions and the middle portion 7c therebetween.

The heater of the present invention is particularly advantageous in semiconductor wafer processing applications. The full thickness of the body 2 at the end portions maintains a relatively cooler temperature at the end portions but the uniform width of the body improves control of the heat distribution pattern. The middle portion 7c of the body has a reduced cross sectional area available for electrical conduction thereby increasing, and improving heater resistance.

EXAMPLE

A heater was fabricated in accordance with this invention having a width of 20 mm and a height of 6 mm, and which exhibited a resistance 0.09 Ω. In comparison, a control heater made of the same type material and having a width of 20 mm width and height of 6 mm, but fabricated without a recess 5 and ribs 6a, 6b, exhibited a resistance of 0.04 Ω. These test results show that the heater resistance is dramatically improved by forming the recess 5 on the underside of the heater body 2.

Figure 4:
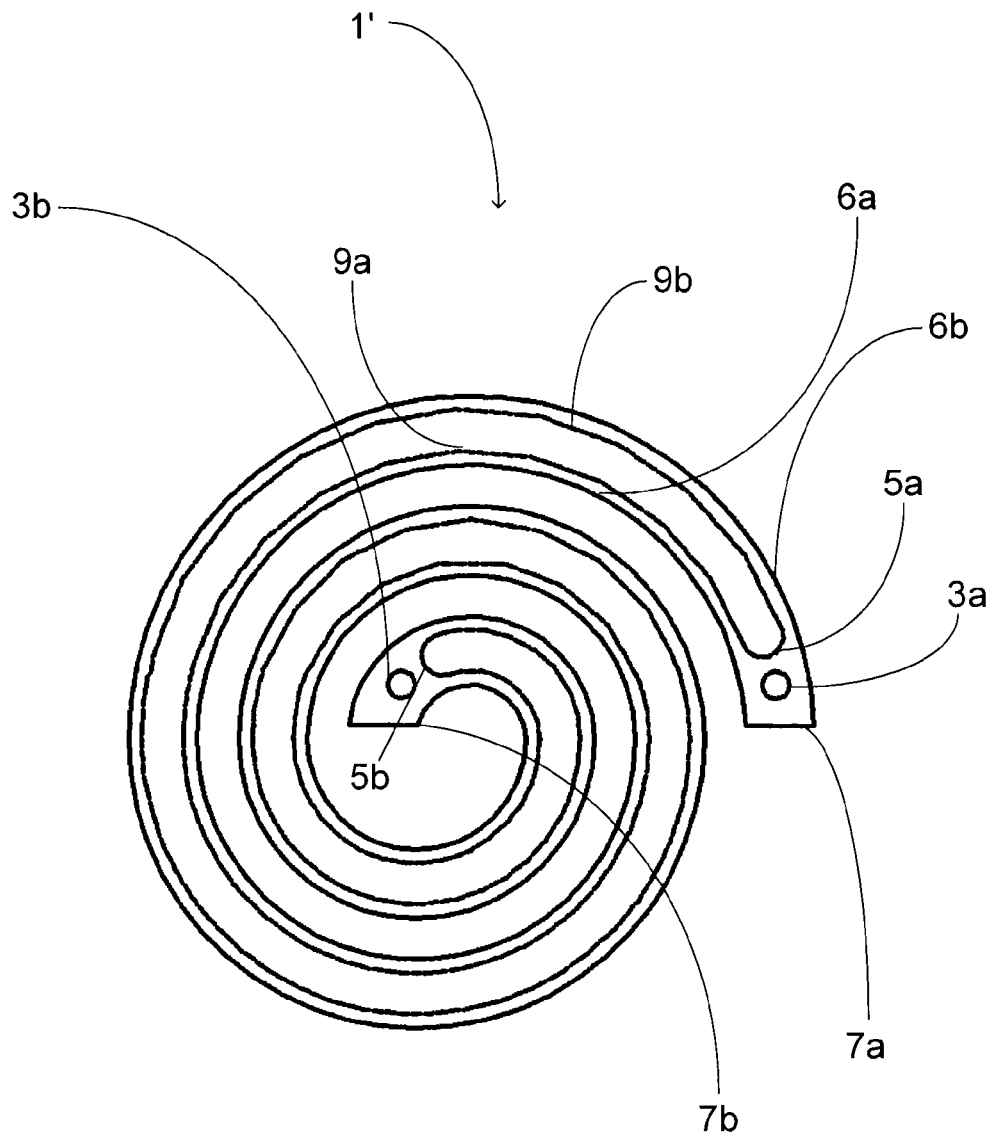
FIG. 4 is a plan view of a heater embodying a spiral shape.
Figure 5:
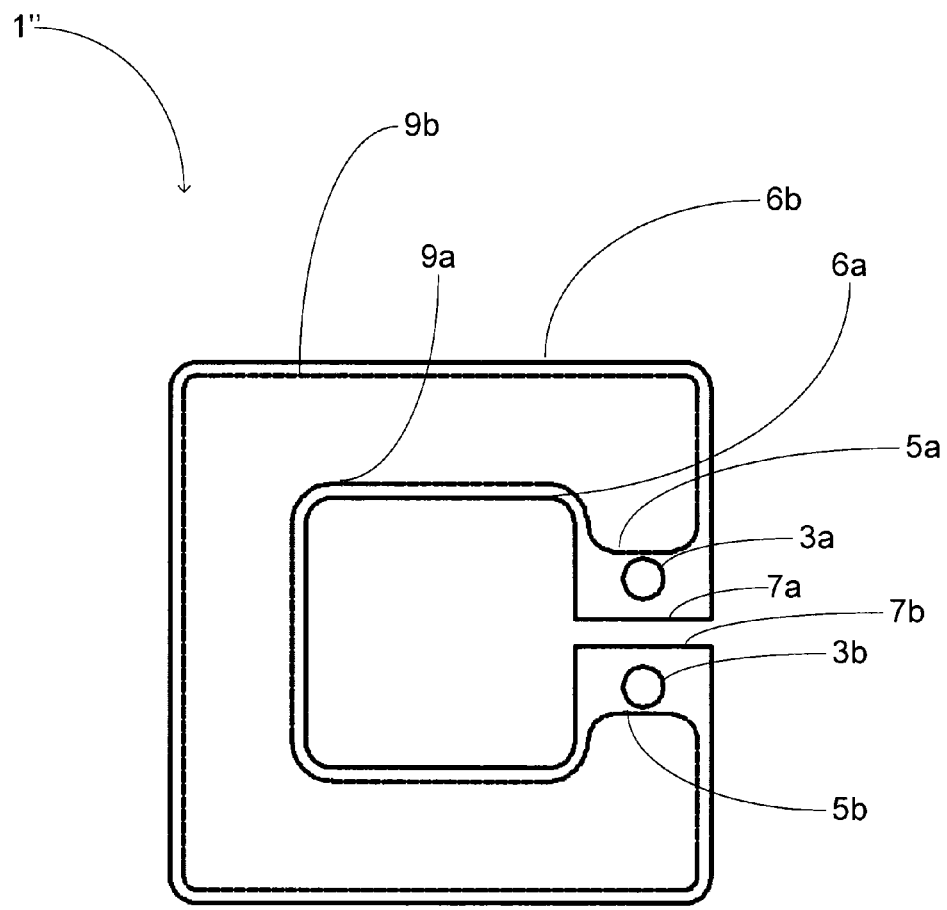
FIG. 5 is a plan view of a heater embodying a rectangular shape.

Although the present invention has been described in reference to a specific embodiment thereof shown in the accompanying drawings, it should be understood that the present invention is not limited to this specific embodiment and involves various modifications and changes without departing as far as they are within the spirit and scope of the invention defined in the appended claims. For example, the heater body is C-shaped in the illustrated embodiment, but in many cases, the heater body can be designed into a spiral heat pattern, such as heater 1' shown in FIG. 4, and as shown in Japanese patent publication No.2005-86117(A), for uniform heating to the wafer or any other object to be heated. In some applications, the heater body is formed into a square or rectangular pattern, such as heater 1" shown in FIG. 5. These and other heater shapes are also within the scope of the present invention.

What is claimed is:

1. A heater comprising a body having a smooth and flat heating surface and a recess formed on a surface opposite to the heating surface so as to provide a U shaped cross-section along at least a portion of the body, said body having first and second opposite end portions, wherein said body includes vertical side walls which are spaced apart so as to define said recess except at the opposite end portions, and said vertical side walls extend in a lengthwise direction of the heater between the end portions, and further wherein the body is spiral shaped.

2. The heater according to claim 1 wherein the body has a substantially uniform width along its entire length.

3. The heater of claim 1 wherein each end portion includes a terminal connecting hole, wherein the end portions have substantially identical width to a heating area defined between said opposite end portions, and said recess is formed on said opposite surface except at said opposite end portions.

4. The heater of claim 1 wherein said body is fabricated from graphite or a ceramic material.

5. The heater of claim 1 wherein the body is coated with pBN or SiC.

6. A method for processing a semiconductor wafer comprising the steps of:
   a) providing a heater having a body having a smooth and flat heating surface and a recess formed on a surface opposite to the heating surface so as to provide a U-shaped cross-section along at least a portion of the body, said body having first and second opposite end portions, wherein said body includes vertical side walls which are spaced apart so as to define said recess, and said vertical side walls extend in a lengthwise direction of the heater between the end portions, and further wherein the body is spiral shaped;
   b) supporting a semiconductor wafer on said heating surface;
   c) applying an electric current to said heater; and
   d) heating the semiconductor wafer to a predetermined temperature.

7. The method of claim 6 wherein said body includes said vertical side walls which are spaced apart so as to define said recess, except at the opposite end portions.

8. The method of claim 6 wherein each end portion includes a terminal connecting hole, wherein the end portions have substantially identical width to a heating area defined between said opposite end portions, and said recess is formed on said surface opposite the heating surface except at said opposite end portions.

9. The method of claim 6 wherein said body is fabricated from graphite or a ceramic material.

10. The method of claim 6 wherein the body is coated with pBN or SiC.

* * * * *